(12) United States Patent
Mosbach et al.

(10) Patent No.: US 10,790,018 B1
(45) Date of Patent: Sep. 29, 2020

(54) STORAGE OF CODES IN MOLECULARLY IMPRINTED POLYMERS

(71) Applicants: Klaus Mosbach, Zurich (CH); JOHANNES KEPLER UNIVERSITÄT LINZ, Linz (AT)

(72) Inventors: Klaus Mosbach, Zurich (CH); Oliver Brüggemann, Wilhering (AT); Jacqueline Wolfschlucker, Zwettl an der Rodl (AT)

(73) Assignee: JOHANNES KEPLER UNIVERSITÄT LINZ, Linz (AT)

( * ) Notice: Subject to any disclaimer, the term of this patent is extended or adjusted under 35 U.S.C. 154(b) by 0 days.

(21) Appl. No.: 16/914,486

(22) Filed: Jun. 29, 2020

Related U.S. Application Data

(62) Division of application No. 16/096,008, filed as application No. PCT/AT2017/060111 on Apr. 27, 2017.

(30) Foreign Application Priority Data

Apr. 29, 2016 (AT) .............................. A 50393/2016

(51) Int. Cl.
   *G11C 13/00* (2006.01)
   *B01J 20/26* (2006.01)
   *G06K 19/06* (2006.01)
   *C08L 101/00* (2006.01)
   *G01N 24/08* (2006.01)

(52) U.S. Cl.
   CPC ......... *G11C 13/0016* (2013.01); *B01J 20/268* (2013.01); *C08L 101/00* (2013.01); *G06K 19/06187* (2013.01); *G01N 24/08* (2013.01)

(58) Field of Classification Search
   CPC .. G11C 13/0016; B01J 20/268; C08L 101/00; G06K 19/06187; G01N 24/08
   USPC ......................................................... 365/151
   See application file for complete search history.

(56) References Cited

U.S. PATENT DOCUMENTS

| | | | |
|---|---|---|---|
| 5,527,681 A | | 6/1996 | Holmes |
| 5,786,428 A | * | 7/1998 | Arnold ............... B01D 15/3828 525/330.3 |
| 5,872,198 A | * | 2/1999 | Mosbach ........... B01D 15/3852 525/199 |

(Continued)

FOREIGN PATENT DOCUMENTS

| | | |
|---|---|---|
| WO | 1995021673 A1 | 8/1995 |
| WO | 2015017442 A2 | 2/2015 |

OTHER PUBLICATIONS

Jean-Francois Lutz, XP055250231, "Coding Macromolecules: Inputting Information in Polymers Using Monomer-Based Alphabets", Macromolecules, Jul. 28, 2015 American Chemical Society, US—ISSN 0024-9297, vol. 48, Nr 14, pp. 4759-4767.

(Continued)

*Primary Examiner* — Viet Q Nguyen
(74) *Attorney, Agent, or Firm* — Liang & Hennessey; Brian E. Hennessey

(57) ABSTRACT

Disclosed is a molecularly imprinted polymer for storing a defined value of a numerical code, more particularly a binary code, in the molecular imprints of said polymer, and a method for the production of said polymer. The molecular imprinting process uses suitable templates comprising a defined sequence of at least two different structural units, each having a different chemical functionality.

16 Claims, 3 Drawing Sheets

(56) References Cited

U.S. PATENT DOCUMENTS

| | | | |
|---|---|---|---|
| 5,874,214 A | | 2/1999 | Nova et al. |
| 6,316,335 B1 | | 11/2001 | Takamori et al. |
| 6,340,588 B1 | | 1/2002 | Nova et al. |
| 6,416,714 B1 | | 7/2002 | Nova et al. |
| 6,451,543 B1 | | 9/2002 | Kochendoerfer et al. |
| 6,468,740 B1 | | 10/2002 | Holmes |
| 7,205,162 B1 | * | 4/2007 | Mosbach ............ B01J 20/268 |
| | | | 424/130.1 |
| 8,153,737 B2 | * | 4/2012 | Yiannikouris ......... B01J 20/26 |
| | | | 526/215 |
| 8,287,908 B2 | | 10/2012 | Kristensen et al. |
| 8,349,257 B2 | * | 1/2013 | Hsu ................. B01J 20/268 |
| | | | 422/68.1 |
| 9,165,979 B2 | | 10/2015 | Tran |
| 10,438,662 B2 | * | 10/2019 | Predki .................. G11C 13/02 |
| 10,640,822 B2 | * | 5/2020 | Predki .................. C12Q 1/6869 |
| 2002/0051996 A1 | | 5/2002 | Siani et al. |
| 2003/0138795 A1 | | 7/2003 | Wu et al. |
| 2003/0204070 A1 | | 10/2003 | Chen et al. |
| 2007/0250298 A1 | | 10/2007 | Tate |
| 2009/0104277 A1 | | 4/2009 | Kristensen et al. |
| 2010/0056764 A1 | | 3/2010 | Urso et al. |
| 2012/0052757 A1 | * | 3/2012 | Hearn ................. C07B 63/00 |
| | | | 442/1 |
| 2016/0288090 A1 | * | 10/2016 | Hearn ................. C08F 226/06 |
| 2018/0068060 A1 | | 3/2018 | Ceze et al. |
| 2019/0080760 A1 | | 3/2019 | Predki et al. |
| 2019/0139603 A1 | * | 5/2019 | Mosbach .......... G06K 19/06187 |
| 2019/0341108 A1 | * | 11/2019 | Predki .................. G11C 13/02 |
| 2019/0383788 A1 | * | 12/2019 | Predki .................. C07H 21/04 |

OTHER PUBLICATIONS

Raj Kumar Roy, "Design and synthesis of digitally encoded polymers that can be decoded and erased", Nature Communications, vol. 6, p. 7237; XP055402208.

Ciardelli XP055402541, "The relevance of the transfer of molecular information between natural and synthetic materials in the realisation of biomedical devices with enhanced properties", Journal of Biomaterials Science. Polymer Edition, Jan. 1, 2005 VSP, Utrecht, NL—ISSN 0920-5063, vol. 16, Nr:2, pp. 219-236.

Nick Goldman, "Towards practical, high-capacity, low-maintenance information storage in synthesized DNA", Nature, 494: 77-80, 2013.

Robert N. Grass, "Robust Chemical Preservation of Digital Information on DNA in Silica with Error-Correcting Codes", Angew. Chem. Int. Ed., 54: 2552-2555, 2015.

George Vlatakis, "Drug assay using antibody mimics made by molecular imprinting", Nature 361: 645-647, 1993.

Karsten Haupt, "Molecularly Imprinted Polymers and Their Use in Biomimetic Sensors" Chem. Rev. 100 (7): 2495-2504, 2000.

Lei Ye, "Molecular Imprinting: Synthetic Materials as Substitutes for Biological Antibodies and Receptors", Chem. Mater., 20 (3): 859-868, 2008.

Reza Arshady, "Synthesis of substrate-selective polymers by hostguest polymerization" Makromol. Chem. 182 (2):687-692, 1981.

Oliver Brüggemann, "New Configurations and Applications of Molecularly Imprinted Polymers" J. Chromatogr. A, 889: 15-24, 2000; (2002).

Oliver Brüggemann, "Molecularly imprinted materials—receptors more durable than nature can provide." Chapter in Advances in Biochemical Engineering / Biotechnology, Special Issue: Modern Advances in Chromatography, Springer, edited by Prof. Dr. R. Freitag.

Jinxiang Liu, "Preparation of protein imprinted materials by hierarchical imprinting techniques and application in selective depletion of albumin from human serum" Sci. Rep., 4:5487.doi:10.1038/srep05487, Jun. 30, 2014.

Huaiqiu Shi, "Template-imprinted nanostructured surfaces for protein recognition" Nature, 398(6728):593-7, Apr. 15, 1999.

Klaus Mosbach, "Generation of new enzyme inhibitors using imprinted binding sites: the anti-idiotypic approach, a step toward the next generation of molecular imprinting", J. Am. Chem. Soc., 123(49): 12420-12421, 2001.

International Search Report and Written Opinion dated Sep. 11, 2017 received in PCT/AT17/60111, pp. 22.

* cited by examiner

STORAGE OF CODES IN MOLECULARLY IMPRINTED POLYMERS

CROSS-REFERENCE TO RELATED APPLICATIONS

This application is a divisional application of U.S. patent application Ser. No. 16/096,008, filed Oct. 24, 2018, entitled "STORAGE OF CODES IN MOLECULARLY IMPRINTED POLYMERS", which is a national phase application of PCT Application No. PCT/AT2017/060111, filed Apr. 27, 2017, which claims priority to AT20160050393, dated Apr. 29, 2016, all of which are incorporated by reference in their entirety.

BACKGROUND

1) Field of the Invention

The invention relates to the storage of numerical codes, more particularly binary codes, in a polymer structure based on a molecularly imprinted polymer that is provided with complementary imprints of a sequence of at least two different chemical functionalities of a template.

2) Description of Related Art

The ability to store digital information on conventional hard drives and similar data carriers will reach its limit in the near future, because the storage densities of such carriers cannot be extended as required. Exponential growth in data volumes requires the development of additional, alternative storage methods or materials. Binary-encoded macromolecules represent here an opportunity for long-term preservation of digital data.

The model for data storage in polymers can be found in natural DNA. Sequences of nucleobases, linked to a phosphate- and sugar molecular-based polymer backbone, carry a large volume of information that can be translated into protein molecules. Such DNA sequences may also be produced synthetically. Specific sequencing of the nucleobases used makes it possible to represent and store digitalized data such as text, images, and audio in binary code ("Towards practical, high-capacity, low-maintenance information storage in synthesized DNA." Nature, 494: 77-80, 2013; "Robust Chemical Preservation of Digital Information on DNA in Silica with Error-Correcting Codes." Angew. Chem. Int. Ed., 54: 2552-2555, 2015).

Non-natural polymers such as poly(alkoxyamine amide)s can also be used, however, to store digital information ("Design and synthesis of digitally encoded polymers that can be decoded and erased." Nat. Commun. 6: 7237, 2015).

In the face of DNA, and with non-natural polymers, the data or codes are thus synthesized directly, wherein the synthesized polymer itself acts as the data storage.

Also known from the prior art is the principle of molecular imprinting of polymers (molecularly imprinted molecules (MIPs)). Molecular imprinting is a technique developed, inter alia, by the Mosbach group; see "Drug assay using antibody mimics made by molecular imprinting." Nature 361: 645-647, 1993; "Molecularly Imprinted Polymers and Their Use in Biomimetic Sensors." Chem. Rev. 100 (7): 2495-2504, 2000; "Molecular Imprinting: Synthetic Materials as Substitutes for Biological Antibodies and Receptors. Chem. Mater." 20 (3): 859-868, 2008; "Synthesis of substrate-selective polymers by hostguest polymerization." Makromol. Chem. 182 (2): 687-692, 1981; "New Configurations and Applications of Molecularly Imprinted Polymers" J. Chromatogr. A, 889: 15-24, 2000; Brüggemann O (2002) "Molecularly imprinted materials—receptors more durable than nature can provide." Chapter in Advances in Biochemical Engineering/Biotechnology, Special Issue: Modern Advances in Chromatography, Springer, edited by Prof. Dr. R. Freitag.

Biomedical uses of MIPs are described by Liu et al. in "Preparation of protein imprinted materials by hierarchical imprinting techniques and application in selective depletion of albumin from human serum." Sci Rep., 4:5487.doi: 10.1038/srep05487, 2014 Jun. 30; by Ciardelli et al. in "The relevance of the transfer of molecular information between natural and synthetic materials in the realization of biomedical devices with enhanced properties." J Biomater Sci Polym Ed., 16(2):219-36, 2005; and by Shi. et al. in "Template-imprinted nanostructured surfaces for protein recognition. Nature, 398(6728):593-7, 1999 Apr. 15.

WO 1995021673 A1 and the publication "Generation of new enzyme inhibitors using imprinted binding sites: the anti-idiotypic approach, a step toward the next generation of molecular imprinting". J. Am. Chem. Soc., 123(49): 12420-12421, 2001 disclose the use of anti-idiotypic methods for MIPs.

In molecular imprinting, first a template molecule is selected. In particular, biomolecules, for example, vitamins, hormones, or proteins are used as the template molecule. The template molecule has, depending on the nature thereof, a plurality of functional groups to which complementary functional groups can bind. Because the functional groups of the template molecule have a specific arrangement relative to one another, the template molecule binds specifically only to another molecule that has the complementary arrangement of the complementary functional groups. In nature, signal molecules bind to receptors according to this principle. In molecular imprinting, a receptor for the template molecule is produced artificially, by bringing different functional monomers having different functional groups into contact with the template molecule, so that the monomers bind to the respective complementary functional group on the template molecule. Doing so does not require knowing the arrangement of the functional groups on the template molecule, which plays no role in the process of molecular imprinting. Once bonded to the template molecule, the monomers are cross-linked to one another, such that the monomers are fixed in the positions and orientations thereof relative to one another, in order to form a polymer. The template molecule is then removed, so that a molecular imprint of the template molecule stays behind in the polymer and can consequently be used as an artificial receptor for the template molecule, in particular, a biomolecule. The information content of the imprint or the MIP is limited to whether or not a biomolecule binds specifically, i.e., is limited to either a YES or a NO. Molecularly imprinted polymers (MIPs) can thus be put to use for specific recognition of the template in chromatographic, extractive, or sensory applications.

SUMMARY OF THE INVENTION

This technique has thus far not been used to store data, or to store digital information or codes.

The invention solves the problem of providing an improved method for storing values or digital data at the molecular level.

The invention solves this problem in that: in a first step, a template molecule or template having a defined sequence of defined functional groups is produced, the sequence representing a defined value of a numerical code, preferably, a digital code, or containing digital data; and in a second step, the defined sequence of the template molecule is transferred according to the method of the molecular imprinting to a polymer by bringing the template into contact with monomers that have complementary functional groups and therefore align themselves according to the sequence of defined functional groups on the template, the monomers being successively fixed to one another by polymerization so that the functional groups henceforth carry the digital data. For improved clarity of reading, the functional groups of the template in succession are called side functionalities, in order to distinguish the terminology therefor from that for the functional groups of the monomers.

The data carriers according to the invention are thus molecularly imprinted polymers (MIPs) that contain a defined sequence of monomers or monomer units having defined functional groups, wherein preferably the functional groups of one monomer unit code for 0 and the functional groups of another monomer unit code for 1. The information content thus lies in the sequence or order of the functional groups on the MIP, and thus represents a numerical code. The radix (number of different functional groups) of the numerical code is preferably two, such that the code is a binary code. If the template is produced with a defined sequence of more than two different functional groups, such that monomers or monomer units having more than two different functional groups bind to the template, it is also possible to store a numerical code that has a higher radix than 2 in the MIP according to the invention.

It is advantageous that selecting the number of monomers and preferably selecting a suitable cross-linker makes it possible to produce molecularly imprinted polymer data carriers that have different properties or shapes, which would not be possible when a molecular data carrier is produced directly, e.g., as DNA.

Within the scope of the invention, therefore, templates having defined sequences of template molecules, which are available with different side functionalities, are produced first, these sequences being carriers for the desired numerical code, more particularly, binary code.

The template thus contains a sequence of at least two template components each having different chemical side functionalities, wherein these two different side functionalities correspond to the binary numbers 0 and 1. It may then occur that a template is composed of a sequence of only one template component, if, for example, the code consists solely of the binary number 0, or solely of the binary number 1. In a preferred embodiment, the template is composed of a sequence of two template components each having different chemical side functionalities, wherein the sequence contains at least 3, 4, 5, 6, 10, 15, 20, or more components.

Examples of possible template components include chemical molecules that differ in the functional side chains thereof, in particular, in the side functionalities thereof. Especially suitable are those molecules that bear a carboxyl group or primary amino group as a side functionality, preferably as terminal groups. Other functional groups are also suitable as side functionalities, however, provided said functional groups are able to form a connection with a complementary group. As template components, it is also possible to use: nucleotides; nucleotide derivatives such as, for example, peptide nucleic acids; basic or acid vinyl monomers; oligomerizable anionic or cationic monomer units and other chemically linkable structural units each having additional side functionalities, such as, for example, omega-hydroxycarboxylic acids with an additional carboxy or amino function, or omega-amino acids with an additional carboxy or amino function.

Examples of especially suitable templates include peptides and proteins that are composed of two different amino acids as template components. Preferably, one template component is an acid amino acid, and the other template component is a basic amino acid. The different enantiomers of these molecules may then also be used.

Peptide nucleic acid (PNA) structures composed of a sequence of two different nucleobase components are also suitable as templates. With such peptide nucleic acids, the sugar phosphate backbone is replaced, for example, with a pseudopeptide.

With the help of the template or at least one template having a defined sequence of side functionalities, a polymer is imprinted according to the invention.

The method according to the invention for producing a molecularly imprinted polymer is performed by imprinting the polymer of the molecularly imprinted polymer by polymerizing the polymer in the presence of at least one template, wherein the template is composed of a defined, selected sequence of structural components, wherein the structural components are selected from at least two types of structural components that differ from one another at least with respect to the side functionalities thereof, wherein templates having any sequence of the structural components thereof—i.e., according to any value of the numerical code—can be produced, wherein at the side functionalities of the template, monomers are bonded with the functional groups thereof that are complementary to the side functionalities, wherein the monomers differ from one another with respect to the functional groups thereof, and wherein the monomers are bonded when the polymerization takes place in the polymer structure of the polymer, and the template is subsequently released with the side functionalities thereof from the monomers, so that the molecularly imprinted polymer comprises a defined value of the numerical code, more particularly, the binary code, formed of the functional groups of successive monomers, corresponding to the selected sequence of the structural components of the template that was used to produce the molecularly imprinted polymer.

Preferably, the monomers—more particularly, the functional groups thereof—are isotopically labelled.

The invention comprises molecularly imprinted polymers (MIPs) containing a defined value of a numerical code, more particularly, a binary code, that are produced according to the method according to the invention.

A preferred embodiment of the invention comprises a molecularly imprinted polymer (MIP) containing a binary code, wherein the molecularly imprinted polymer (MIP) contains a defined sequence of monomers, wherein the functional group of one monomer codes for the binary number 0 and the functional group of another monomer codes for the binary number 1.

Another embodiment of the invention comprises a molecularly imprinted polymer (MIP) containing a numerical code, more particularly, a binary code, wherein the monomers of the molecularly imprinted polymer (MIP) differ from one another with respect to the functional groups thereof.

Another preferred embodiment of the invention comprises a molecularly imprinted polymer (MIP) containing a binary code, wherein one monomer or monomer unit of the MIP has an acidic group, e.g., a carboxyl group, and the other monomer or other monomer unit of the MIP comprises a basic group, e.g., an amino group.

Another preferred embodiment of the invention comprises a molecularly imprinted polymer (MIP) containing a binary code, wherein one monomer of the MIP is methacrylic acid and the other monomer is 2-aminoethyl methacrylate.

Another embodiment of the invention comprises a molecularly imprinted polymer (MIP) containing a numerical code, more particularly, a binary code, wherein the sequence of the monomers has at least a length of three monomers, wherein the monomers may be identical or different.

A sequence or stored numerical value may preferably have a length of at least 3, 5, 8, 10, 15, 20, 25, 30, 50 monomers.

Another preferred embodiment of the invention comprises a molecularly imprinted polymer (MIP) containing a binary code, wherein the sequence has a length of at least three monomers, wherein at least one monomer of the sequence bears a carboxyl group and at least one monomer of the sequence bears an amino function.

Preferably, the molecularly imprinted polymer is produced according to the following steps:
  a. producing the template, the template being produced as a freely-definable sequence of template components having different chemical side functionalities, wherein one template side functionality can be recognized as logical 1 and one template side functionality can be recognized as logical 0;
  b. adding the monomers, which have complementary functional groups to the side functionalities of the template;
  c. self-organization by the monomers at the side functionalities of the template components via the complementary functional groups thereof;
  d. fixing the complementary binary code by polymerizing the monomers in order to produce the polymer; and
  e. removing the template from the polymer so that the functional groups of the monomer units are exposed, such that the polymer exists as a molecularly imprinted polymer, wherein the sequence of the functional groups forms the defined value of the binary code.

The complementary monomers, i.e., the monomers added in step b) may be selected, for example, from anionic and cationic monomers. Examples of anionic monomers include monomers having electron-withdrawing substituents, such as nitrile, carboxyl, phenyl, and vinyl groups, such as acrylic acid, methacrylic acid, crotonic acid, itaconic acid, fumaric acid, maleic acid, monomethyl itaconate, monomethyl fumarate, monobutyl fumarate, maleic anhydride, acrylamido glycolic acid, styrenesulfonic acid, vinylsulfonic acid, vinylphosphonic acid, 2-acrylamido-2-methylpropane phosphonic acid, 2-acrylamido-2-methyl-1-propanesulfonic acid, and derivatives of the anionic monomers mentioned in this paragraph.

Examples of cationic monomers include—but are not limited to—cationic ethylenically unsaturated monomers such as diallyldialkylammonium halides such as diallyl dimethyl ammonium chloride, the (meth)acrylates of dialkylaminoalkyl compounds such as dimethylaminoethyl (meth)acrylate, diethylaminoethyl (meth)acrylate, dimethylaminopropyl (meth)acrylate, 2-hydroxydimethylaminopropyl (meth)acrylate, aminoethyl (meth)acrylate, and salts and quaternary compounds thereof, N,N-dialkylaminoalkyl (meth)acrylamide such as N,N-dimethylaminoethyl acrylamide and salts and quaternary compounds thereof, and derivatives of the cationic monomers mentioned in this paragraph.

Suitable complementary monomers thus contain complementary functional groups.

The molecularly imprinted polymer is preferably biodegradable.

This invention also comprises methods for reading out the code of a molecularly imprinted polymer according to the invention.

A first method according to the invention for reading out the stored information of a molecularly imprinted polymer that has a defined sequence of different functional groups reflecting a defined value of a numerical code, more particularly, a binary code, is performed by bringing the molecularly imprinted polymer into contact with a pool of analyte templates, wherein the analyte templates have different side functionalities that are complementary to the functional groups of the molecularly imprinted polymer, wherein the analyte templates differ from one another with respect to the order of side functionalities thereof, so that only that analyte template that has the sequence of side functionalities that is complementary to the functional groups binds specifically to a sequence of different functional groups of the numerical code of the molecularly imprinted polymer.

Thus, that analyte template that corresponds to the template that was used to produce the molecularly imprinted polymer analyte template binds specifically to the molecular imprint of the molecularly imprinted polymer according to the invention. Preferably, the analyte templates of the pool have been isotopically labelled.

A second method according to the invention for reading out the stored information of a molecularly imprinted polymer that is selectively provided with a defined sequence of different functional groups reflecting a defined value of a numerical code, more particularly, a binary code, is performed by using an anti-idiotypic method to read out the stored information, the method comprising the steps of:
  a. producing a pool of molecules that are template components having different side functionalities, wherein each type of template component has one side functionality that is complementary to one of the functional groups of the defined sequence;
  b. bringing the pool of template components into contact with the molecularly imprinted polymer, wherein the imprint of the molecularly imprinted polymer that has the stored value of the numerical code acts as a reaction chamber, so that template components bind to the different functional groups of the imprint according to the respective side functionalities thereof, such that a replica of the template that may have been used or was used to produce the stored value of the numerical code is created in the imprint; and
  c. reading out the stored value by characterization of replicas by means of an analytical method.

The second method according to the invention for reading out the value of the code of the MIP thus differs from the first in that only the template components are used, instead of templates composed of bonded template components. This is advantageous in that it is not necessary to produce all of the relevant variants of analyte templates and bring the same into contact with the molecularly imprinted polymer, but rather only the template components from which the templates or analyte templates were formed. In the case of a binary code, thus, only two different template components are required in the second readout method according to the invention.

Preferably, the template components of the pool have been isotopically labelled.

BRIEF DESCRIPTION OF THE DRAWINGS

The drawings provide a more detailed illustration, by way of example, of the method according to the invention on the basis of several embodiment variants. The drawings show.

In the chemical structural formula, "PG" stands for "protecting group."

DETAILED DESCRIPTION

Figure 1:
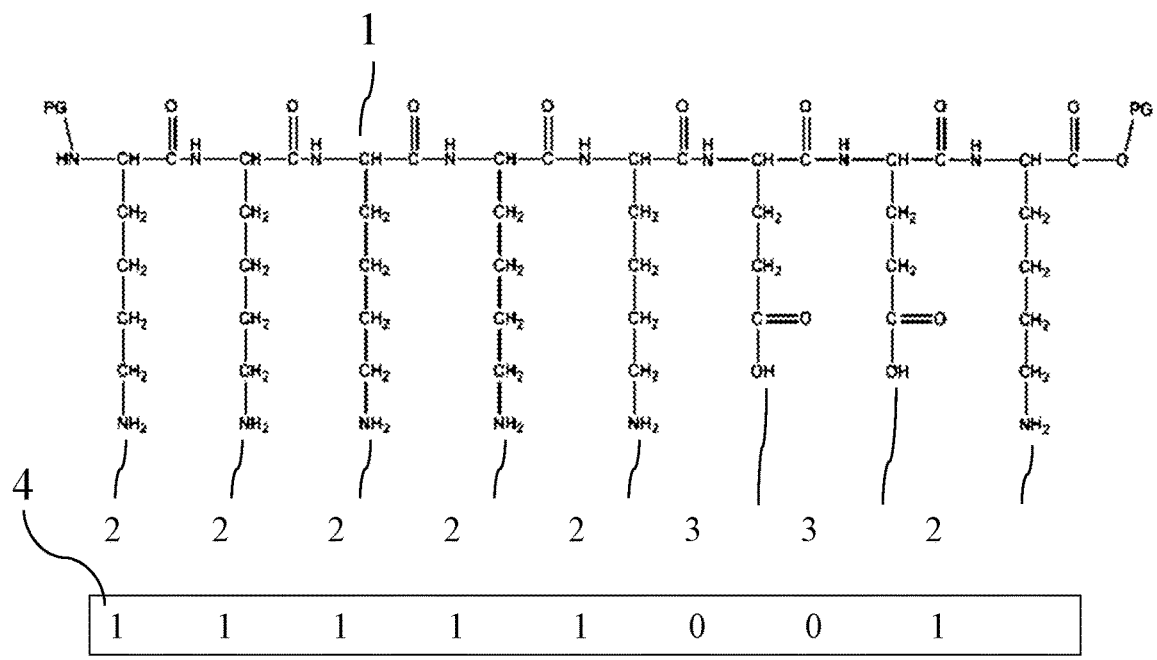
FIG. 1. an exemplary template molecule having a binary code based on two different template components (lysine and glutamic acid)

The octapeptide lysine-lysine-lysine-lysine-lysine-glutamic acid-glutamic acid-lysine is used as a template 1, by way of example (see FIG. 1). With lysine and glutamic acid, the template 1 has two different template components that differ from one another with respect to the side functionalities 2, 3 thereof. In the example of FIG. 1, the amino function, as the side functionality 2 of the lysine, acts as a binary "1" while the carboxyl function, as the side functionality 3 of the glutamic acid, acts as a binary "0." The following sequence of side functionalities 2, 3—read from left to right—thus arises for the example template 1 depicted in FIG. 1: Amino-Amino-Amino-Amino-Amino-Carboxy-Carboxy-Amino, thus 11111001 as the value of the binary code 4.

Figure 2:
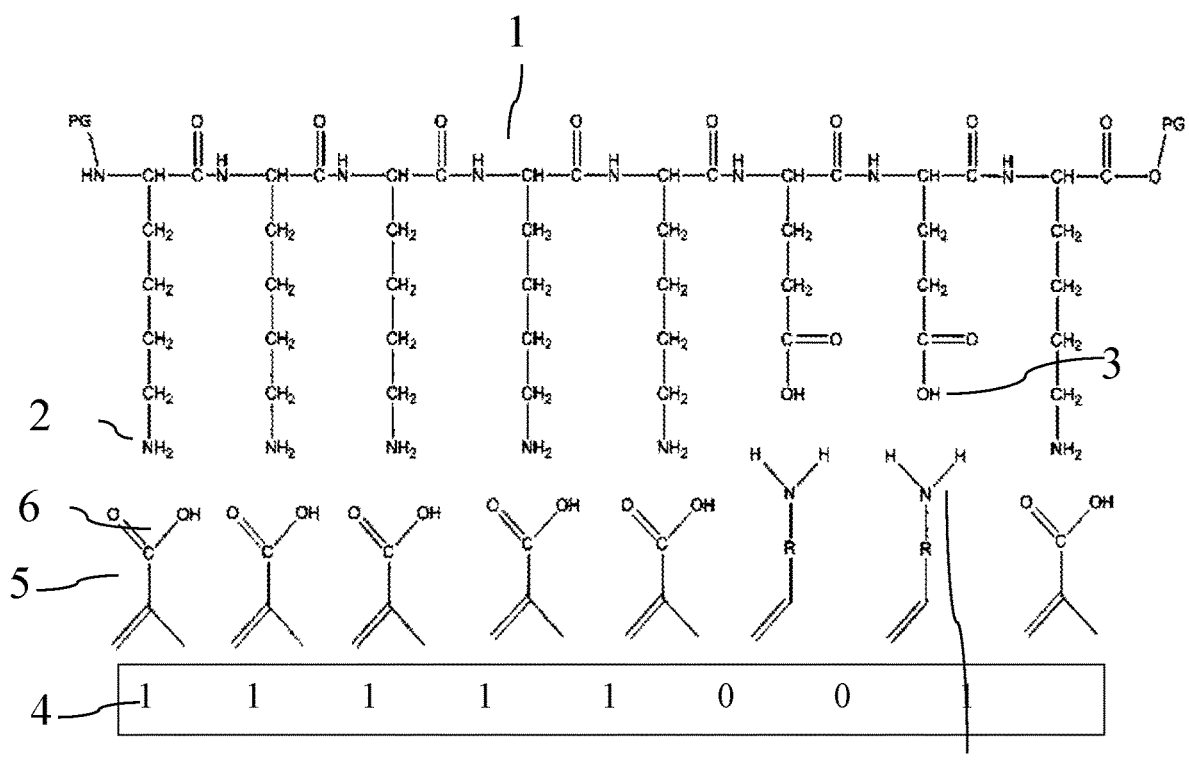
FIG. 2. an exemplary template molecule in electrostatic interaction with corresponding, complementary functional monomers.

The addition of at least two different monomers 5 having functional groups 6, 7 that are complementary to the side functionalities 2, 3 of the template 1 is followed then by a wait for the self-organization of the template 1 and monomers 5 via the functionalities thereof, so that the monomers 5 bind to the side functionalities 2, 3 according to the functional groups 6, 7 thereof, as is illustrated in FIG. 2.

Suitable monomers 5 thus contain complementary functional groups. Thus, as illustrated in the example, the first monomer 5—methacrylic acid, with the functional group 6 thereof—is complementary to the side functionality 2 in the form of the amino function of the template component lysine. The second monomer 5, in the form of 2-aminoethyl methacrylate with the functional group 7 thereof in the form of an amino-functionalized side chain, is complementary to the side functionality 3 in the form of the carboxy function of the template component glutamic acid. Thus, the functionally complementary monomers 5 organize themselves with the template components through the complementary functional groups thereof. In the example of FIG. 2, the acid function of the methacrylic acid organizes itself with the basic function of the lysine, and the basic function of the 2-aminoethyl methacrylate organizes itself with the acidic function of the glutamic acid of the octapeptide that forms the template 1. Electrostatic interactions thus form stable compounds. After a cross-linking monomer has been added, the monomers 5 can be polymerized to thereby fix and store the complementary template structure and thus the binary code 4. Examples of suitable monomeric cross-linkers include ethylene glycol dimethacrylate, butylene glycol dimethacrylate (or butane-1,4-diol dimethacrylate), and hexamethylene dimethacrylate (or hexane-1,6-diol dimethacrylate).

Figure 3:
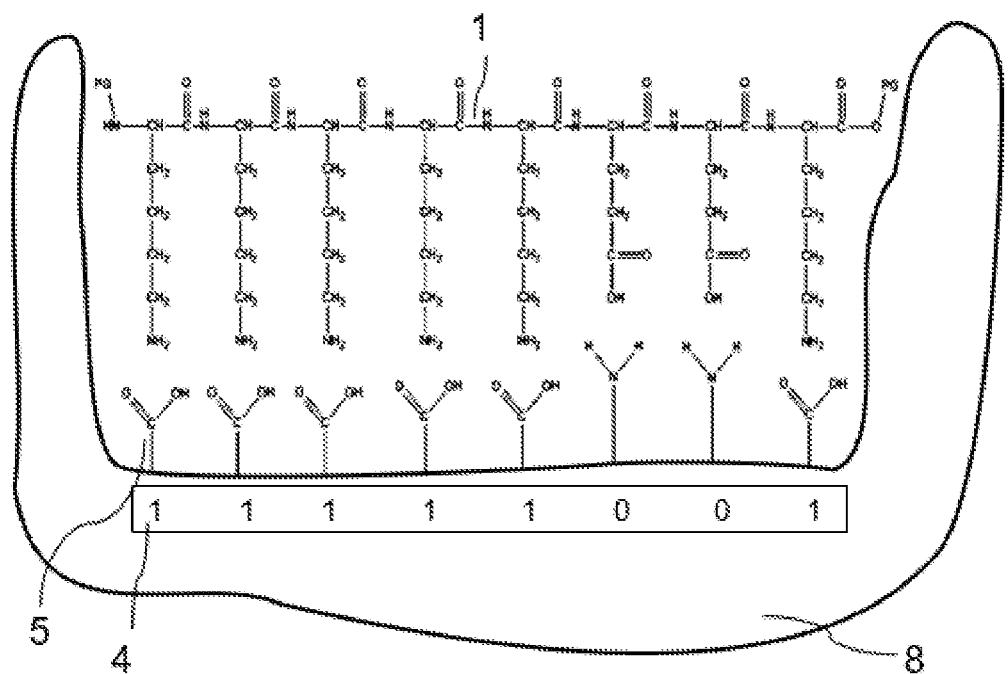
FIG. 3. the molecular imprint of the exemplary template molecule in the polymer, wherein the template molecule is still embedded.

In FIG. 3, the monomers 5 are depicted in the cross-linked state thereof, i.e., the monomers are components of a polymer 8 or are bonded to a polymer 8. As is represented, the template 1 is still bonded to the polymer 8 after the polymerization.

Figure 4:
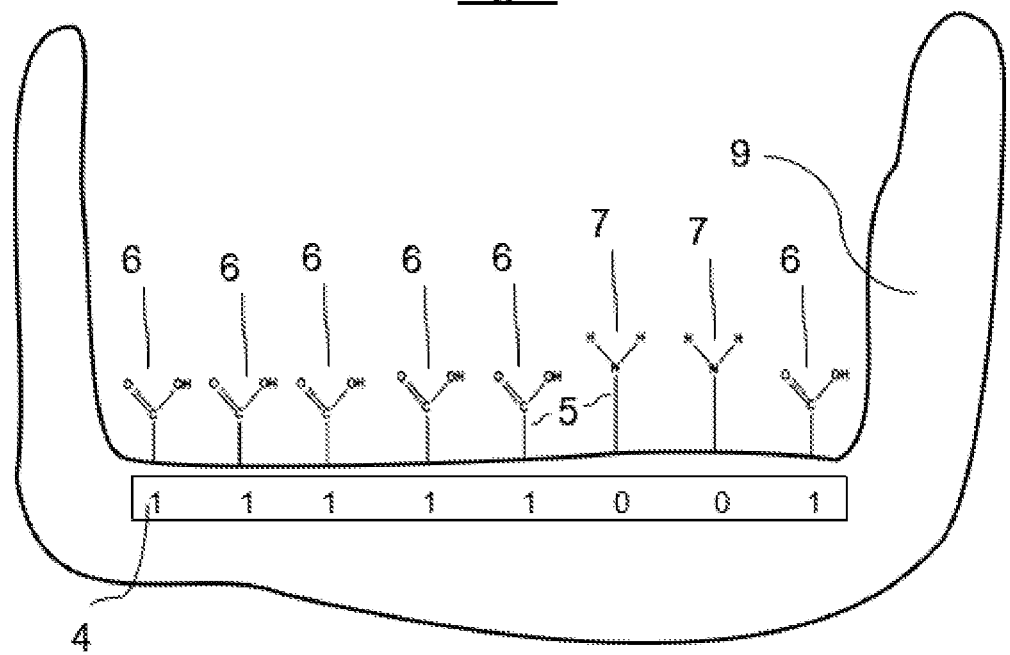
FIG. 4. the molecular imprint of the exemplary template molecule in the polymer, after the template molecule has been removed.

As depicted in FIG. 4, the template 1 is removed from the polymer 8. After the template 1 has been removed with the original binary code 4 thereof, then, the functionalities of the previous monomers 5 remain behind in the resulting molecular imprints of the polymer 8 in an immobilized configuration, such as the template 1 was set forth. The polymer 8, after the template 1 has been removed, thus exists as the molecularly imprinted polymer 9. The molecularly imprinted polymer 9 has, in an exposed state, the functional groups 6, 7 of the cross-linked monomers 5, which form the binary code 4 of the molecularly imprinted polymer 9, i.e., according to the example, the code sequence or the stored value 11111001.

Figure 5:
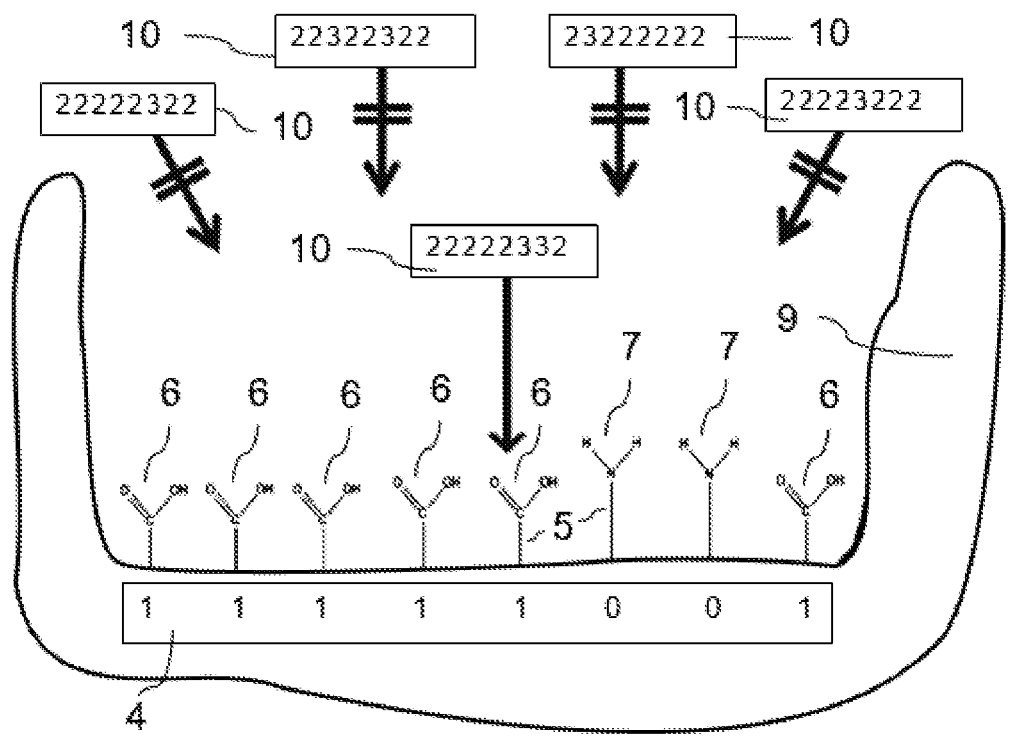
FIG. 5. the specific recognition of the binary code stored in the molecular imprint of the polymer, through the template molecule.

As illustrated in FIG. 5, the thus-stored value of the binary code 4 is read out from the molecular imprints of the MIPs 9 according to a first variant according to the invention by stirring a mixture of analyte templates 10 also containing an analyte template 10 that corresponds to the original template 1 with a suspension of MIP particles, and measuring the residual content of the analyte templates 10 in the supernatant of the MIP particles after an adsorption phase. The content of the analyte template 10 that corresponds to the original template 1 is diminished in comparison to the other analyte template 10 because that analyte template 10 binds specifically as the sole molecule in the molecular imprints. This makes it possible to determine which value of the binary code 4 is present in the molecular imprint of the MIP 9. As shown, the analyte template 10 that has the sequence of side functionalities 2, 3 that is complementary to the sequence of the functional groups 6, 7 of the MIP 9 binds specifically to the imprint, i.e., the sequence 22222332 binds specifically to the sequence 66666776, i.e., according to the example, the side functionality sequence Amino-Amino-Amino-Amino-Amino-Carboxy-Carboxy-Amino of the template component sequence Lysine-Lysine-Lysine-Lysine-Lysine-Glutamic acid-Glutamic acid-Lysine binds to the functional group sequence Carboxy-Carboxy-Carboxy-Carboxy-Carboxy-Amino-Amino-Carboxy of the monomers 5.

According to a second readout method according to the invention, the binary code 4 may also be read out by adding solutions of chemical structural components of the original template molecules according to a type of anti-idiotypic method and then replicating these template molecules in the molecular imprints, it being possible to determine the code thereof after elution and analytical characterization. This second readout method according to the invention is thus performed by producing a pool of molecules that contain at least the original template components of the template 1 that was used to produce the MIP 9. This pool is brought into contact with the MIP 9, wherein the molecular imprint, i.e., the binary code 4, of the MIP 9 acts as a reaction chamber. The complementary template components of the pool bind to the molecular imprint, thereby producing replicas of the original templates 1. These replicas may be characterized by means of analytical methods, for example, by means of chromatographic methods, and thus the stored code 4 can be read out. The molecular imprint in the MIP 9 may act, on the one hand, as a copy room for replicating the original template 1, while the molecular imprint may also be used, on the other hand, to produce different variants or derivatives of the original template 1, depending on the choice of chemical components, with an unaltered sequence of the side group functionalities, i.e., of the binary code 4. In other words, the code in the MIP 9 can be used to produce duplicates or derivatives of the template 1, which can be used in turn as data or information carriers, or can be used to produce other MIPs 9. The MIPs 9 according to the invention can thus be copied or replicated.

Figure 6:
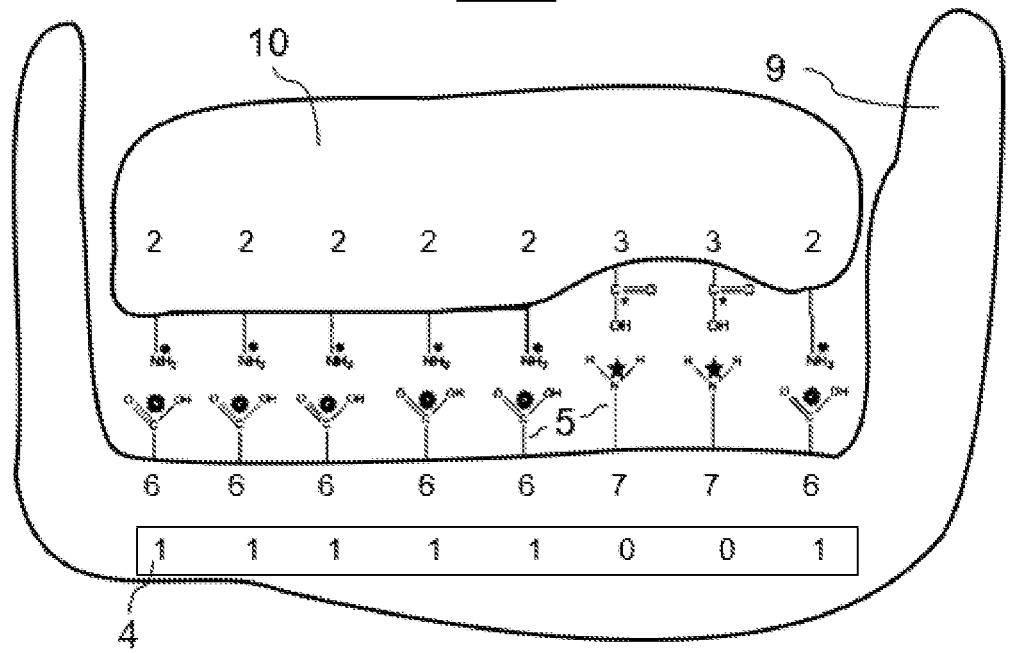
FIG. 6. the reading out of the stored binary code through spatially-resolved solid state NMR in the molecular imprint. Selective isotopic labelling of the molecular imprint or the monomer units and template molecules enables magnetic dipolar interactions.

FIG. 6 illustrates a method for reading out the stored binary code directly at the MIP 9 by spatially-resolving solid state NMR. NMR stands for nuclear magnetic resonance. It is to be provided according to the invention that the monomers 5 and the template component binding thereto have a selective isotopic labelling, which is achieved, for example, by selecting the nitrogen atoms of the amino functions and the carbon atoms of the carboxy functions of both the side functionalities 2, 3 of the template components and the functional groups 6, 7 of the monomers 5 in the form of $^{15}N$ and $^{13}C$ isotopes, respectively. With spatially-resolving, multi-nuclear, multi-dimensional solid state NMR, the binary code 4 is read out according to the invention by measuring a dipolar recoupling by means of rotational echo double resonance (REDOR) or radio frequency-driven recoupling (RFDR) spectroscopy on the basis of the aforementioned isotopic labelling, and thus being able to determine the structure and orientation of the template 1, or an identical analyte template 10, in the MIP 9 and thus the order of the functional groups 6, 7 in the MIP 9 and therewith the value of the binary code 4.

The isotopically labelled template components in the MIP 9 may, on the basis of the first readout method according to the invention, be bonded by bringing a pool of different isotopically labelled analyte templates 10 differing from one another in the order of the isotopically labelled template components thereof in contact with the MIP 9, so that only that isotopically labelled analyte template 10 that has the value of the binary code 4 of the original template 1 binds to the imprint of the MIP 9, as is illustrated in FIG. 6.

The second readout method according to the invention—which follows a type of anti-idiotypic method—may preferably be carried out with isotopically labelled template components. The isotopically labelled template components bind with the respective side functionalities 2, 3 thereof to the complementary functional groups 6, 7 of the imprint, i.e., according to the order of the binary code 4, such that the isotopically labelled template components together form a duplicate or derivative of the original template 1, which exists according to the analyte template 10 of FIG. 6 in the isotopically labelled imprint of the MIP 9.

Because the measurable interaction between the isotopes of the bonded analyte template 10 and the isotopes of the monomers 5 differ according to the order of the arrangements thereof, the value of the binary code 4 can be determined directly at the MIP 9.

The molecularly imprinted polymers 9 described herein are produced in the presence of the template 1, preferably via a surface, precipitation, suspension, emulsion, or mass polymerization in a batch or semi-batch process, and put to use in different forms, preferably in the form of spherical particles, or—especially preferably—in the form of polymer coatings.

The spherical particles or polymer coatings may be used, for example, to encode for products of every kind. Due to the size down to the nanometer range, the MIPs 9 are invisible to the consumer when applied to long-lasting products, so that the origin thereof can be unambiguously determined even after a long period of time has passed. The MIPs 9 can thus contain, for example, detailed information on the actual origin of the original products, so that the products can be distinguished from counterfeits. Plastic matrices may be provided directly with the described molecular imprints and thus be encoded or generally put to use as data carriers. For example, specific manufacturer or customer data, or simply the date of production, may be left as a numerical value or in binary form in the imprint.

It is also possible to produce multi-MIPs 9, wherein a plurality of different templates 1 are used, in order to imprint, in parallel, different numerical codes, more particularly, binary codes 4 having different information into molecular imprints. One MIP 9 can thus comprise a plurality of different molecular imprints, which may differ from one another with respect to the code sequence and/or code length thereof.

Thus, another embodiment comprises MIPs 9 that contain at least two different values of a numerical code, more particularly, a binary code 4.

In one embodiment of the invention, the MIPs 9 are used to recognize and/or code for foodstuffs, consumer goods, industrial goods, and components or ingredients thereof.

Example 1

To produce a molecularly imprinted polymer 9 according to the invention as an example, the tripeptide glutamic acid-lysin-lysine (EKK) was used as the template 1. The value of the binary code 4 present in the amino acid sequence corresponds thus to 100. The formulation of this template polymer is set forth in table 1.

TABLE 1

Composition of the molecularly imprinted polymer (MIP1) with use of the template EKK, with molar mass, calculated and actually-measured mass of the substances, and the equivalents thereof

| Substance | Molar mass g/mol | Estimated | Actual | Equivalent |
|---|---|---|---|---|
| Template EKK | 625.31 | 15 mg | 15.67 mg | 1 |
| Methacrylamide | 86.04 | 33.00 mg | 33.54 mg | 15.6 |
| Methacrylic acid | 85.05 | 32.64 mg | 33.65 mg | 15.8 |
| Ethylene glycol dimethacrylate | 198.22 | 237.75 mg | 237.38 mg | 47.8 |
| Azobisiso-butyronitrile | 164.21 | 1.17 mg | 1.42 mg | 0.35 |
| Acetonitrile | 41.05 | 3.75 mL | 3.75 mL | — |
| Dimethyl-sulfoxide | 78.13 | — | 0.2 mL | — |

With the exception of the initiator azobisisobutyronitrile, all of the components were dissolved in a mixture of acetonitrile and dimethyl sulfoxide. The solution was stirred for 4 hours in order to make it possible to create electrostatic interactions such as hydrogen bonds and—in addition, after proton transfer—ionic bonds between the template 1 and the functional monomers 5 methacrylamide and methacrylic acid. The initiator azobisisobutyronitrile is then added thereto, and the solution was sprayed for 5 minutes with gaseous nitrogen. Then, in a refrigerator at 6° C., the solution was placed in a UV reactor and subjected to 24 hours of UV radiation. The suspension formed was subsequently stirred for 24 hours with 6 mL of a methanol-acetic acid mixture (9:1, v:v), in order to purify the polymer 8 and, in particular, to remove the template molecules. The resulting molecularly imprinted polymer 9 was then filtered and washed twice with a methanol-acetic acid mixture and four times with acetonitrile. The molecularly imprinted polymer 9 was subjected to 5 more minutes of suction as a first round of drying. Further drying steps included spraying the solid with gaseous nitrogen for 5 minutes, and depositing in a drying oven at 40° C. for a period of 24 hours. The yield of the white-colored, powdery molecularly imprinted polymer 9 was 219.66 mg.

The template 1 (the tripeptide EKK) as analyte and other comparison analytes/analyte templates 10 (the tripeptides KEK, EKE, EEK, EEE) were each dissolved in 0.1 mL of dimethyl sulfoxide and 8 mL of acetonitrile, and the powdery MIP 9 was suspended therein. Table 2 lists the exact details of these affinity assays. These suspensions were each stirred for 18 hours at room temperature. 2 mL was then removed from each of these suspensions and centrifuged at a rotational speed of 10,000 RPM. The resulting supernatants were diluted with 8 mL of acetonitrile and the solutions were then subjected to spectroscopic measurement at a wavelength of 300 nm.

TABLE 2

Affinity assays with the molecularly imprinted polymer MIP1 with different tripeptides, the absolute masses used thereof, the masses of the molecularly imprinted polymer MIP1 used, and the measured concentrations of the tripeptides in the supernatant after reaching equilibrium.

| Analyte (peptide sequence) | Mass of analyte/mg | Mass of MIP/mg | Concentration in supernatant based on measured absorption $C_{calc}$, mg/mL |
|---|---|---|---|
| KEK | 2.11 | 10.43 | 0.073 |
| EKK* | 2.12 | 10.39 | 0.043 |
| EKE | 2.08 | 10.20 | 0.069 |
| EEK | 2.10 | 9.94 | 0.072 |
| EEE | 2.16 | 10.31 | 0.117 |

(E = glutamic acid, K = lysine) * corresponds to the original template molecule

This example showed that the MIP 1 has a particular affinity to the original template EKK (line marked with *), with an especially high adsorption due to specific molecular imprints, or with an especially low residual content in the supernatant of only 0.043 mg/mL, in comparison to the four other tripeptides KEK (0.073 mg/mL), EKE (0.069 mg/mL), EEK (0.072 mg/mL), and EEE (0.117 mg/mL). In this manner, it was possible to read back, from a key set of five tripeptide molecules (KEK, EKK, EKE, EEK, and EEE), the matching key (EKK) due to the stored information, i.e., the sequence EKK or the binary code 100.

The invention claimed is:

1. A method for reading out stored information of a molecularly imprinted polymer that comprises a defined sequence of different functional groups with which a meaning of a defined value of a numerical code is associated, comprising:
   bringing the molecularly imprinted polymer into contact with a pool of analyte templates,
   wherein the analyte templates have different side functionalities that are complementary to the functional groups of the molecularly imprinted polymer, and
   wherein the analyte templates differ from one another with respect to an order of side functionalities thereof, so that the analyte template that has a sequence of side functionalities that is complementary to the functional groups binds specifically to a sequence of different functional groups of the numerical code of the molecularly imprinted polymer.

2. The method according to claim 1, wherein the pool of analyte templates contains the template complementary to the sequence of the functional groups as well as isomers, enantiomers, and/or variants of the complementary template.

3. The method according to claim 1, wherein the analyte template of the pool and monomers of the molecularly imprinted polymer that comprise the functional groups are isotopically labelled.

4. The method according to claim 3, wherein the information is read out by spatially-resolving dipolar solid state NMR.

5. A method for reading out stored information of a molecularly imprinted polymer that is selectively provided with a defined sequence of different functional groups reflecting a stored value of a numerical code, wherein an anti-idiotypic method is used to read out the stored value, the method comprising:
   producing a pool of molecules that are template components having different side functionalities, wherein each template component has one side functionality that is complementary to one of the functional groups of the defined sequence;
   bringing the pool into contact with the molecularly imprinted polymer, wherein an imprint of the molecularly imprinted polymer that comprises the stored value of the numerical code acts as a reaction chamber, so that the template components bind to the different functional groups of the imprint according to respective side functionalities thereof, such that a replica of the template used to produce the stored value of the numerical code is created in the imprint; and
   reading out the stored value by characterization of replicas by means of an analytical method.

6. The method according to claim 5, wherein the template components of the pool and monomers of the molecularly imprinted polymer that comprise the functional groups are isotopically labelled.

7. The method according to claim 6, wherein the information is read out by spatially-resolving dipolar solid state NMR.

8. A method for reading out the stored information of a molecularly imprinted polymer that comprises a defined sequence of functional groups with which the meaning of a defined value of a numerical code is associated, comprising:
   bringing said molecularly imprinted polymer into contact with a pool of template components or analyte templates, which analyte templates are a sequence of said template components;
   wherein said analyte templates differ from one another with respect to an order of side functionalities thereof, wherein said template components have different side functionalities that are complementary to said functional groups of said molecularly imprinted polymer, and wherein said template components or analyte templates that have a sequence of side functionalities that is complementary to said sequence of functional groups of the numerical code of the molecularly imprinted polymer bind specifically to said functional groups of said polymer.

9. The method according to claim 8, wherein said template components or said analyte templates that are sequences of said template components and monomers of the molecularly imprinted polymer that comprise said functional groups are isotopically labelled.

10. The method according to claim 9, wherein said stored information is read out by spatially-resolving dipolar solid state NMR.

11. The method according to claim 8, wherein said code is a binary code, and two different template components and thus only two different side functionalities are used.

12. A method for reading out the stored information of a molecularly imprinted polymer that comprises a defined sequence of functional groups with which the meaning of a defined value of a numerical code is associated, by the use of template components, wherein multiple template components are used that differ from each other with respect to their side functionalities, said side functionalities are complementary to said functional groups of said molecularly imprinted polymer, the method comprising:

bringing said molecularly imprinted polymer into contact with a pool of template components or multiple different sequences of said template components, which sequences of said template components differ from one another with respect to an order of side functionalities thereof, wherein said template components bind specifically to said defined sequence of functional groups of said polymer.

13. The method according to claim 12, wherein said template components or said sequences of said template components and monomers of the molecularly imprinted polymer that comprise the functional groups are isotopically labelled.

14. The method according to claim 13, wherein said information is read out by spatially-resolving dipolar solid state NMR.

15. The method according to claim 12, wherein said numerical code is a binary code, and two different template components that differ from each other with respect to their side functionalities are used.

16. A method for retrieving information, comprising:

forming a molecularly imprinted polymer comprising a defined sequence of functional groups, the functional groups being adapted to bind with respective side functionalities of template components of templates, the side functionalities of the template components adapted to bind to a defined sequence of functional groups of the molecularly imprinted polymer; and contacting the molecularly imprinted polymer with a pool of templates having template components, the templates differing from one another with respect to an order of template components thereof, the functional groups binding with the respective side functionalities, the template having the template components ordered so that the side functionalities are complementary to the functional groups of the molecularly imprinted polymer binding with the molecularly imprinted polymer, an order of the template components of the template binding with the molecularly imprinted polymer defining a stored value.

* * * * *